United States Patent
Hu et al.

(10) Patent No.: US 12,433,006 B2
(45) Date of Patent: Sep. 30, 2025

(54) SEMICONDUCTOR DEVICE WITH CONDUCTIVE LINERS OVER SILICIDE STRUCTURES AND METHOD OF MAKING THE SEMICONDUCTOR DEVICE

(71) Applicant: TAIWAN SEMICONDUCTOR MANUFACTURING COMPANY, LTD., Hsinchu (TW)

(72) Inventors: Kuan-Kan Hu, Hsinchu (TW); Shuen-Shin Liang, Hsinchu (TW); Chia-Hung Chu, Hsinchu (TW); Po-Chin Chang, Hsinchu (TW); Hsu-Kai Chang, Hsinchu (TW); Ken-Yu Chang, Hsinchu (TW); Wei-Yip Loh, Hsinchu (TW); Hung-Yi Huang, Hsinchu (TW); Harry Chien, Hsinchu (TW); Sung-Li Wang, Hsinchu (TW); Pinyen Lin, Hsinchu (TW); Chuan-Hui Shen, Hsinchu (TW); Tzu-Pei Chen, Hsinchu (TW); Yuting Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 738 days.

(21) Appl. No.: 17/695,075

(22) Filed: Mar. 15, 2022

(65) Prior Publication Data
US 2023/0299168 A1    Sep. 21, 2023

(51) Int. Cl.
*H10D 30/62* (2025.01)
*H10D 64/01* (2025.01)
*H10D 64/62* (2025.01)
*H01L 23/522* (2006.01)
*H01L 23/528* (2006.01)
*H01L 23/532* (2006.01)
*H10D 30/67* (2025.01)

(52) U.S. Cl.
CPC ......... *H10D 64/62* (2025.01); *H10D 30/6219* (2025.01); *H10D 64/01* (2025.01); *H01L 23/5226* (2013.01); *H01L 23/5283* (2013.01); *H01L 23/53266* (2013.01); *H10D 30/6729* (2025.01)

(58) Field of Classification Search
CPC ............ H01L 23/5226; H10D 30/6219; H10D 30/794; H10D 64/664
USPC ....................................................... 257/382
See application file for complete search history.

(56) References Cited

U.S. PATENT DOCUMENTS

| 6,436,829 | B1 * | 8/2002 | Layadi | ................ | H01L 21/7684 438/692 |
| 2017/0103948 | A1 * | 4/2017 | Lee | ..................... | H10D 30/6219 |
| 2022/0077301 | A1 * | 3/2022 | Kang | ................. | H10D 30/6219 |

* cited by examiner

*Primary Examiner* — Hoai V Pham
(74) *Attorney, Agent, or Firm* — Birch, Stewart, Kolasch & Birch, LLP

(57) ABSTRACT

A semiconductor device includes a semiconductor substrate, an epitaxial structure, a silicide structure, a conductive structure, and a protection segment. The epitaxial structure is disposed in the semiconductor substrate. The silicide structure is disposed in the epitaxial structure. The conductive structure is disposed over the silicide structure and is electrically connected to the silicide structure. The protection segment is made of metal nitride, is disposed over the silicide structure, and is disposed between the silicide structure and the conductive structure.

20 Claims, 13 Drawing Sheets

US 12,433,006 B2

SEMICONDUCTOR DEVICE WITH CONDUCTIVE LINERS OVER SILICIDE STRUCTURES AND METHOD OF MAKING THE SEMICONDUCTOR DEVICE

BACKGROUND

With the continuous development of semiconductor technology, geometry size of semiconductor devices has decreased and various new materials and/or manufacturing processes are being introduced, which may bring new challenges to the design and manufacturing of the semiconductor devices. One of the challenges faced by modern semiconductor engineers is the increase of resistance in the semiconductor devices, which needs to be address in order to make faster and more energy efficient devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
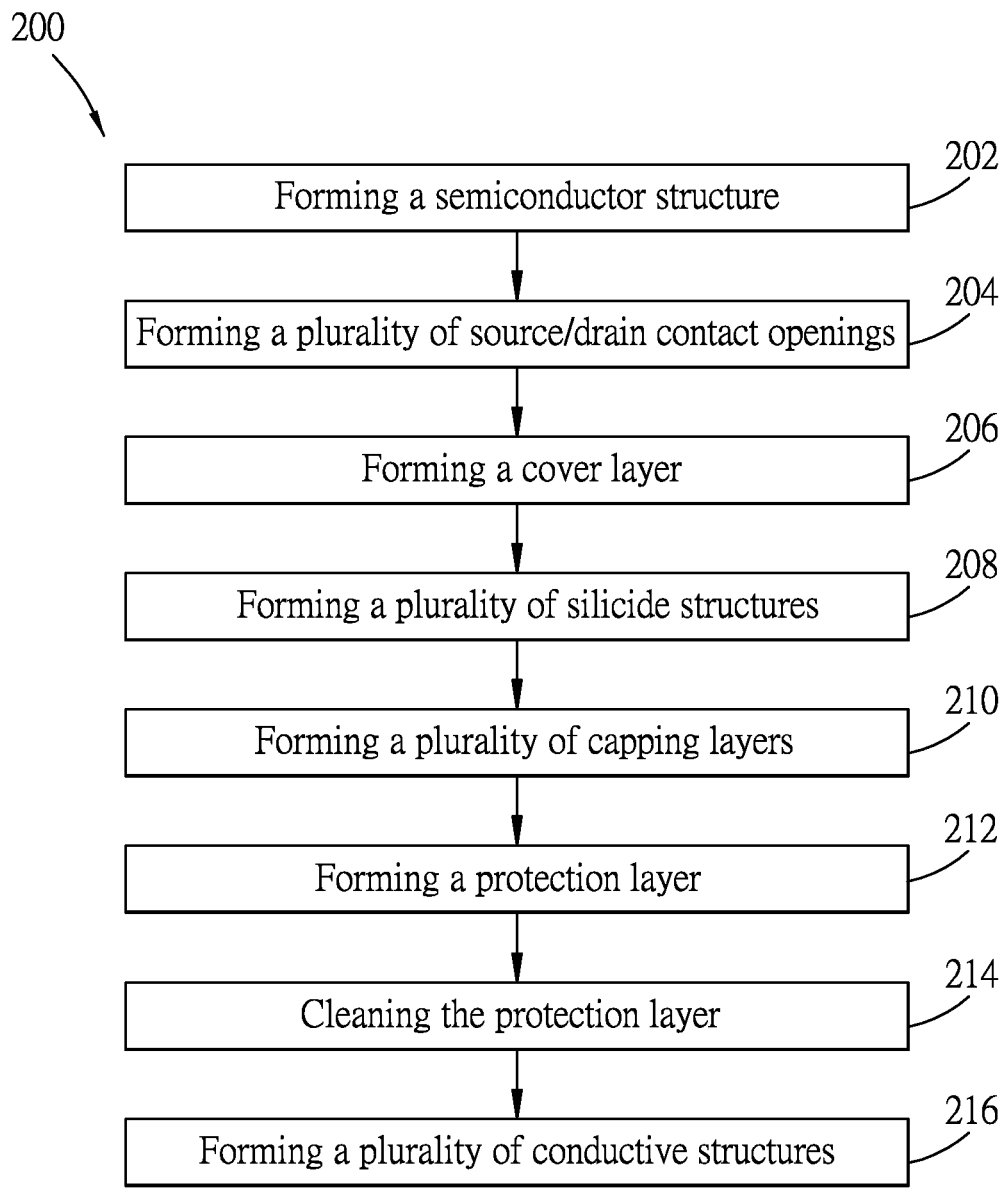
FIG. 1 is a flow chart showing a method of manufacturing a semiconductor device.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 200 of manufacturing a semiconductor device 300 (see FIG. 11) in accordance with some embodiments of this disclosure. FIGS. 2 to 11 are schematic views showing intermediate stages of the method 200 as depicted in FIG. 1. Additional steps which are not limited to those described in the method 200, can be provided before, during or after manufacturing of the semiconductor device 300, and some of the steps described herein may be replaced by other steps or be eliminated. Similarly, additional features may be present in the semiconductor device 300, and/or features present may be replaced or eliminated in additional embodiments.

Figure 2:
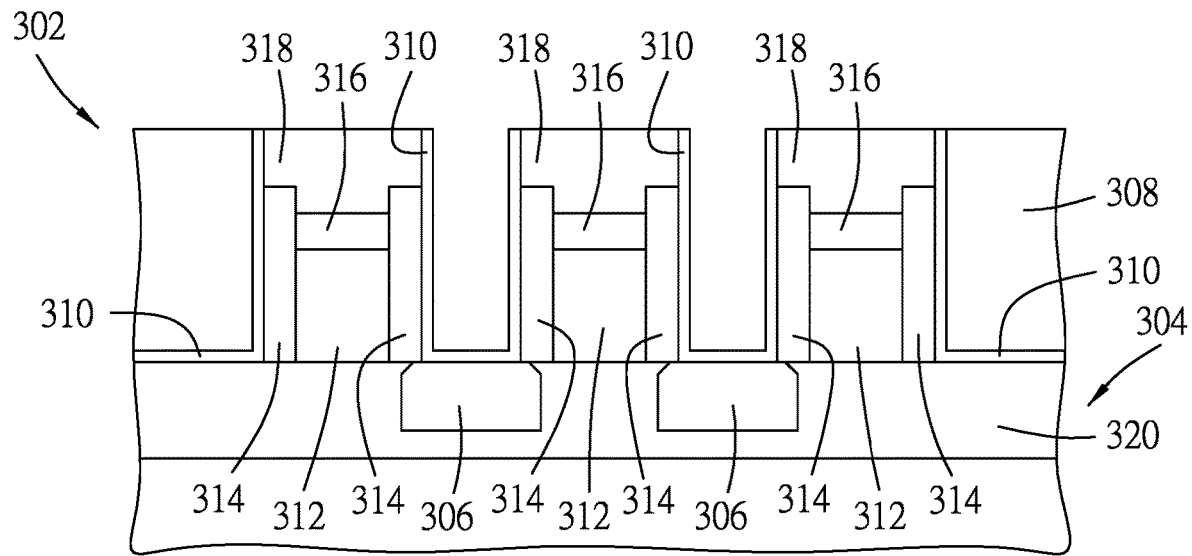
FIGS. 2 to 11 show intermediate steps of a method of manufacturing a semiconductor device.

Referring to FIG. 1, the method 200 begins at step 202, where a semiconductor structure is formed. Referring to FIG. 2, in some embodiments, the semiconductor structure 302 includes a semiconductor substrate 304, a plurality of epitaxial structures 306 that are disposed in the semiconductor substrate 304 and that are spaced apart from each other, an interlayer dielectric layer 308 that is disposed on the semiconductor substrate 304, a plurality of contact etch stop layers 310 that are disposed in the interlayer dielectric layer 308 (two of the contact etch stop layers 310 are illustrated to be respectively disposed above the epitaxial structures 306), a plurality of gate structures 312 that are disposed in the interlayer dielectric layer 308, over the semiconductor substrate 304 and among the epitaxial structures 306, a plurality of spacers 314 that are disposed in the interlayer dielectric layer 308 and that are connected to side walls of the gate structures 312, a plurality of conductive features 316 each being disposed on a respective one of the gate structures 312 and between a corresponding two of the spacers 314, and a plurality of hard masks 318 each being disposed on a respective one of the conductive features 316 and on the corresponding two of the spacers 314. In some embodiments, each of the hard masks 318 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, the semiconductor device 300 (see FIG. 11) is exemplified to be a fin field-effect transistor (FinFET) device, where the semiconductor substrate 304 includes a plurality of fins 320 (one is schematically shown in FIG. 2). As shown in FIG. 2, the epitaxial structures 306 are disposed in the fin 320. The semiconductor device 300 is not limited to be a FinFET device, and can be a planar field-effect transistor device, a gate-all-around (GAA) transistor device, a nanosheet transistor device, nanowire transistor device, or other suitable devices. In some embodiments, the conductive features 316 may be omitted, according to practical requirements. In some embodiments, each of the spacers 314 may include multiple sub-layers that may be made of the same or different materials, according to practical requirements.

In some embodiments, the semiconductor substrate 304 may be a suitable substrate, such as an elemental semiconductor or a compound semiconductor. The elemental semiconductor may contain a single species of atom, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, other suitable materials, or any combination thereof.

In some embodiments, the epitaxial structures 306 may be made by metal-organic chemical vapor deposition (MOCVD), molecular beam epitaxy (MBE), liquid phase epitaxy (LPE), vapor phase epitaxy (VPE), selective epitaxial growth (SEG), other suitable techniques, or any combination thereof. In some embodiments, each of the epitaxial structures 306 may be made of Si, Ge, SiGe, GaAs, AlGaAs, GaAsP, SiP, SiC, SiCP, InAs, AlAs, InP, GaN, InGaAs, InAlAs, GaSb, AlSb, AlP, GaP, other suitable period III-V compound semiconductor materials, other suitable period II-VI compound semiconductor materials, other suitable materials, or any combination thereof. In certain embodiments, the epitaxial structures 306 are sources or drains.

In some embodiments, the interlayer dielectric layer 308 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, the interlayer dielectric layer 308 may be made by chemical vapor deposition (CVD), atomic layer deposition (ALD), physical vapor deposition (PVD), other suitable techniques, or any combination thereof.

In some embodiments, each of the gate structures 312 may include a gate electrode made of polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, other suitable materials, or any combination thereof, which may be made by ALD, CVD, plating (including electroplating, electroless plating, etc.), other suitable techniques, or any combination thereof.

In some embodiments, each of the conductive features 316 may be made of tungsten (e.g., fluorine-free tungsten (FFW)), cobalt, ruthenium, titanium nitride, other suitable conductive materials, or any combination thereof. In some embodiments, each of the conductive features 316 may be made by CVD, ALD, PVD, other suitable techniques, or any combination thereof. In some embodiments, each of the conductive features 316 may serve to reduce resistance between the respective one of the gate structures 312 and a respective one of subsequently formed contacts.

In some embodiments, each of the hard masks 318 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, each of the hard masks 318 may be made by CVD, ALD, PVD, other suitable techniques, or any combination thereof.

In some embodiments, each of the spacers 314 may be made of silicon oxide, silicon nitride, silicon carbide, silicon oxynitride, other suitable materials, or any combination thereof. In some embodiments, each of the spacers 314 may be made by CVD, ALD, PVD, other suitable techniques, or any combination thereof.

In some embodiments, each of the contact etch stop layers 310 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, each of the contact etch stop layers 310 may be made by CVD, ALD, PVD, other suitable techniques, or any combination thereof.

Figure 3:
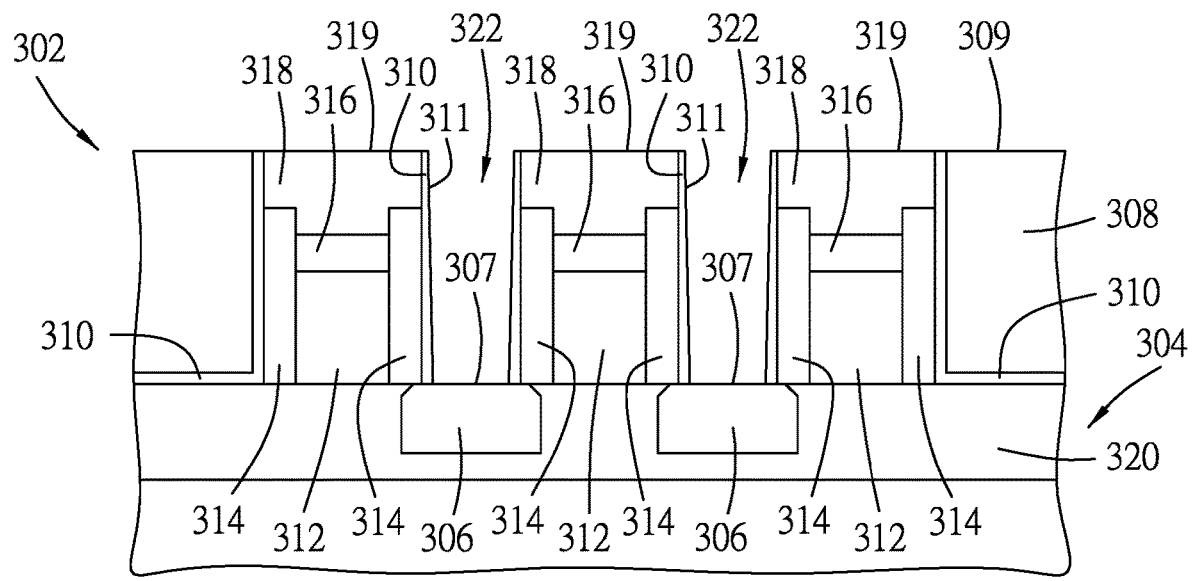

Referring to FIG. 1, in a step 204 of the method 200, a plurality of source/drain contact openings are formed. Referring to FIG. 3, in some embodiments, each of the source/drain contact openings 322 is formed to penetrate the interlayer dielectric layer 308 and a corresponding one of the contact etch stop layers 310 such that a respective one of the epitaxial structures 306 is exposed from the source/drain contact opening 322. In some embodiments, the hard masks 318 may serve as an etching mask during the process of forming the source/drain contact openings 322 to precisely define the location of the source/drain contact openings 322, thereby eliminating the need for an extra etching mask and eliminating the possibility of photolithographic misalignment when forming openings in the extra etching mask. In some embodiments, upper portions of the contact etch stop layers 310 may be slightly etched during step 204 of forming the source/drain contact openings 322. In some embodiments, each of the source/drain contact openings 322 may be defined by a sidewall 311 of a corresponding one of the contact etch stop layers 310 and an upper surface 307 (i.e., an exposed surface) of the respective one of the epitaxial structures 306.

Figure 4:
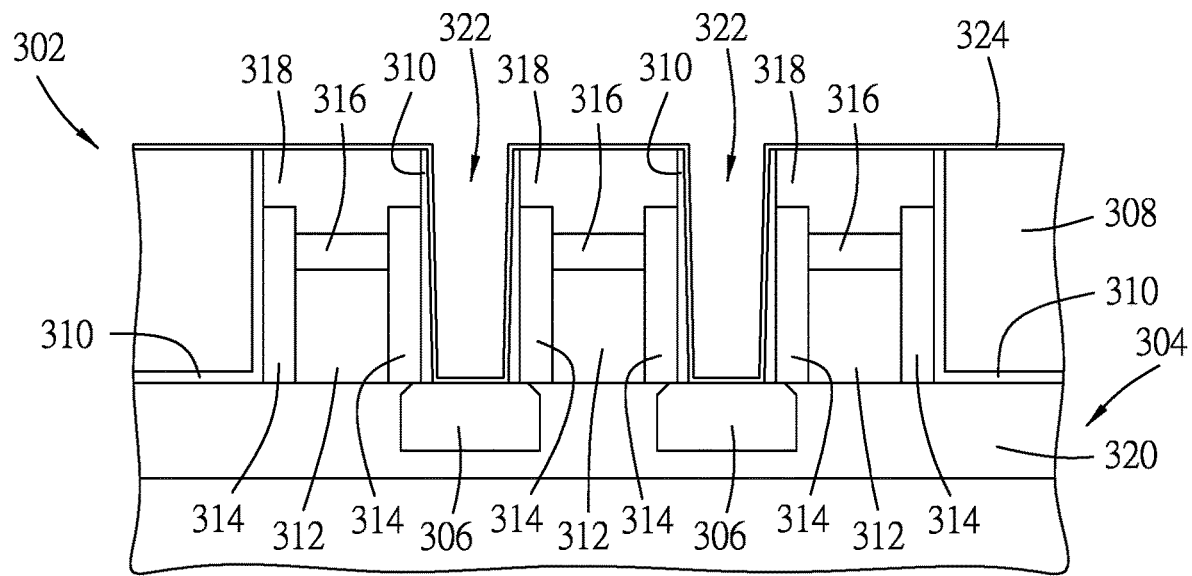

Referring to FIG. 1, in a step 206 of the method 200, a cover layer is formed. Referring to FIGS. 3 and 4, in some embodiments, the cover layer 324 may be conformally formed on an upper surface 309 of the interlayer dielectric layer 308, upper surfaces 319 of the hard masks 318, the sidewalls 311 of the contact etch stop layers 310, and the upper surfaces 307 of the epitaxial structures 306. In some embodiments, the cover layer 324 may be made of silicon nitride, other suitable materials, or any combination thereof. In some embodiments, the cover layer 324 may be formed by ALD, CVD, PVD, other suitable techniques, or any combination thereof.

Figure 5:
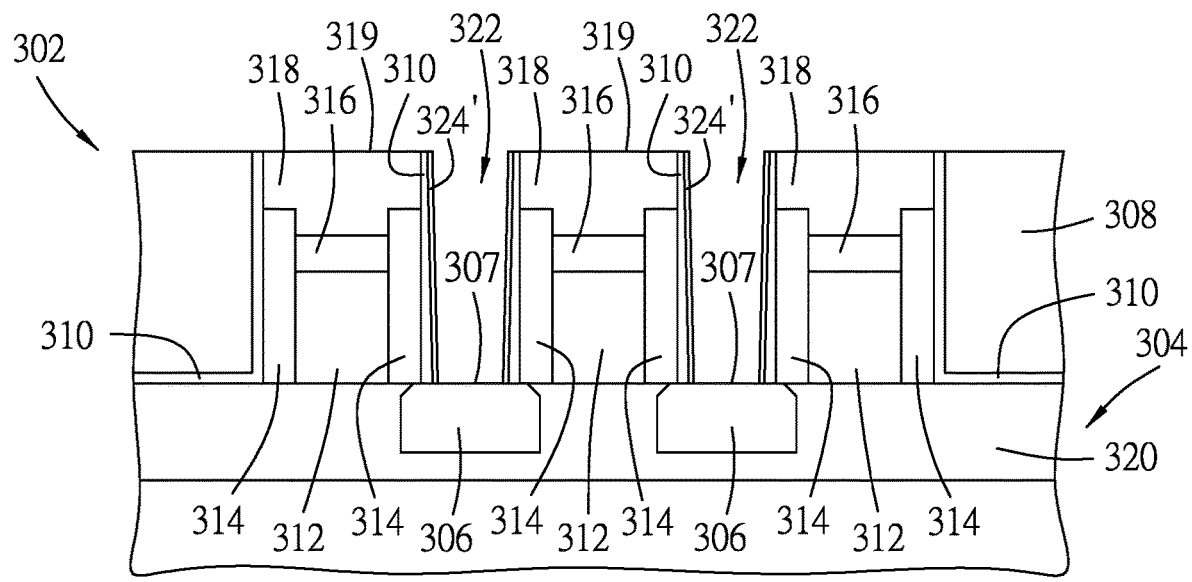

Referring to FIGS. 4 and 5, in some embodiments, portions of the cover layer 324 on the upper surface 309 of the interlayer dielectric layer 308, the upper surfaces 319 of the hard masks 318 and the upper surfaces 307 of the epitaxial structures 306 are removed by dry etching, other suitable techniques, or any combination thereof, thereby forming a plurality of cover segments 324' respectively on the sidewalls 311 of the contact etch stop layers 310 (see FIG. 3) and respectively in the source/drain contact openings 322. In some embodiments, the cover segments 324' may be made of silicon nitride, other suitable materials, or any combination thereof. That is, the remaining portions of the cover layer 324 after the etching process are left on the sidewalls 311 of the contact etch stop layers 310.

Figure 6:
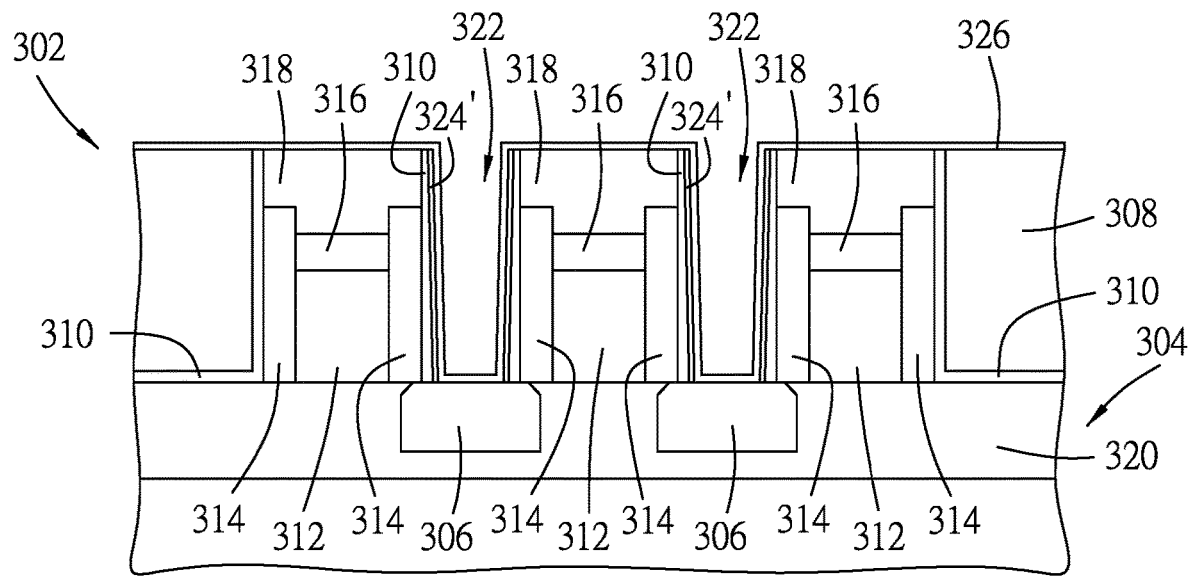
Figure 7:
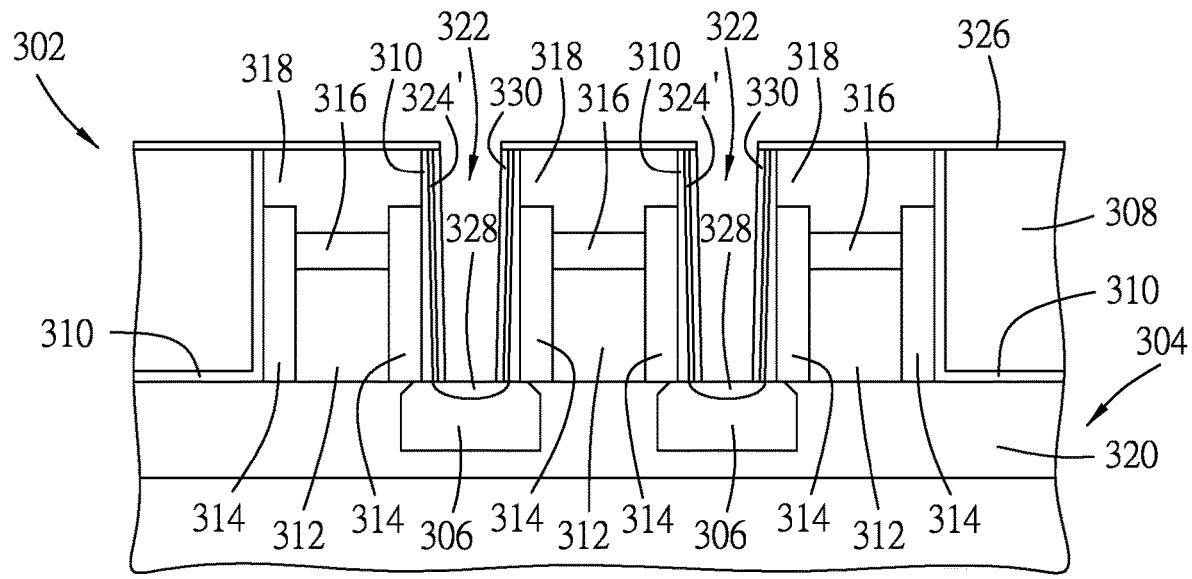

Referring to FIG. 1, in a step 208 of the method 200, a plurality of silicide structures are formed. Referring to FIGS. 5 and 6, in some embodiments, a metal layer 326 is formed on the upper surface 309 of the interlayer dielectric layer 308, the cover segments 324', and the upper surfaces 307 of the epitaxial structures 306. In some embodiments, the metal layer 326 may be made of Ti, Ni, Co, other suitable materials, or any combination thereof. In some embodiments, the metal layer 326 may be made by ALD, CVD, PVD, other suitable techniques, or any combination thereof. Referring to FIGS. 6 and 7, in some embodiments, the semiconductor structure 302 may be heated (i.e., annealed) to a suitable temperature for a suitable duration, where the metal layer 326 on the upper surfaces 307 of the epitaxial structures 306 (see FIG. 5) may react with the epitaxial structures 306 to form a plurality of the silicide structures 328 respectively in the epitaxial structures 306. In some embodiments, during the heating process, the metal layer 326 on the cover segments 324' may react with the cover segments 324' to form a plurality of insulating layers 330 respectively on the cover segments 324'. In some embodiments, the insulating layers 330 may be made of metal silicon nitride, other suitable materials, or any combination thereof. In some embodiments, each of the silicide structures 328 may be made of NiSi, TiSi, TiNiSi, TiSiGe, NiSiGe, TiNiSiGe, RuSi, CoSi, MoSi, PtSi, TaSi, WSi, CrSi, ZrSi, other suitable materials, or any combination thereof. In some embodiments, when the cover segments 324' are exemplified to be made of silicon nitride, and when the metal layer 326 is exemplified to be made of Ti, the insulating layers 330 are made of TiSiN. In some embodiments, the metal layer 326 may be formed under an elevated temperature, so that the silicide structures 328 and the insulating layers 330 are formed during the deposition of the metal layer 326. In some embodiments, prior to the formation of the metal layer 326, a pre-silicide implantation process may be performed for facilitating the subsequent silicide growth. In some embodiments, during the pre-silicide implantation process, portions of the epitaxial structures 306 exposed from the source/drain contact openings 322 may be implanted with Ge, B, other suitable dopants, or any combination thereof. In some embodiments, after the pre-silicide implantation process and prior to the formation of the metal layer 326, the exposed surfaces (i.e., the upper surfaces 307) of the epitaxial structures 306 may be subjected to a pre-clean process, such as cleaning the upper surfaces 307 of the epitaxial structures 306 with fluorine-gas-containing plasma, other suitable chemicals, or any combination thereof. Then the semiconductor structure 302 may be heated (i.e., annealed) to a suitable temperature for a suitable duration to remove any residues from the pre-clean process.

Figure 8:
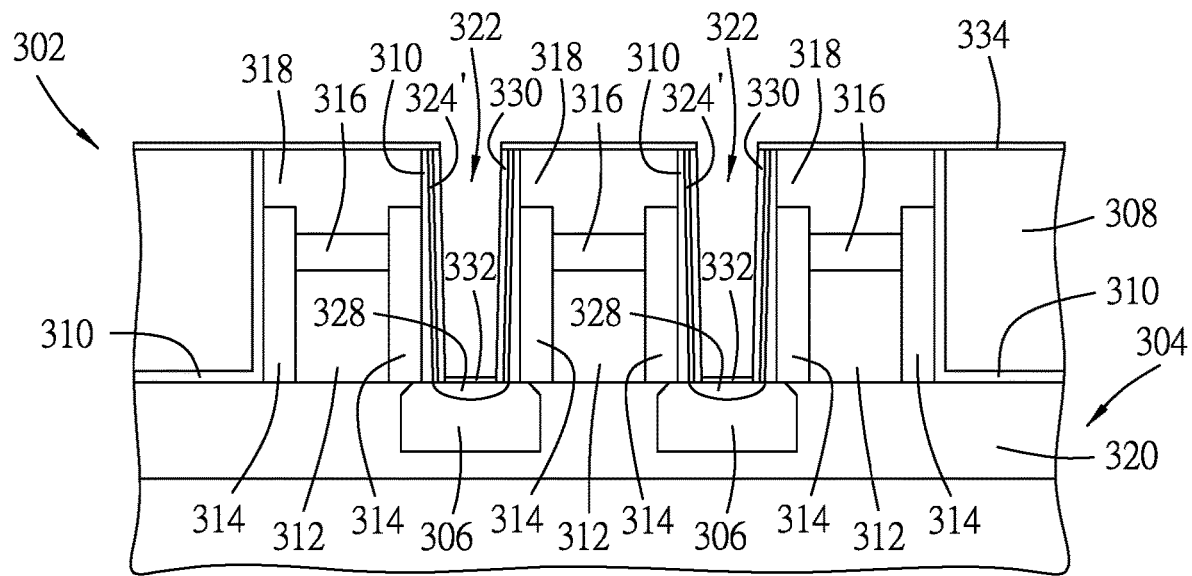

Referring to FIG. 1, in a step 210, a plurality of capping layers are formed. Referring to FIGS. 7 and 8, in some embodiments, the semiconductor structure 302 may be subjected to a treatment with nitrogen-containing plasma, such as a combination of $N_2$ and $NH_3$ plasma, or other suitable chemicals. The nitrogen-containing plasma may react with the silicide structures 328 to form the capping layers 332 respectively covering the silicide structures 328 for protecting the silicide structures 328. In some embodiments, the capping layers 332 may be made of metal silicon nitride, other suitable materials, or any combination thereof. The nitrogen-containing plasma may also react with the metal layer 326 on the upper surface 309 of the interlayer dielectric layer 308 and the upper surfaces 319 of the hard masks 318 (see FIG. 5), so that the metal layer 326 is formed into a metal nitride layer 334.

Figure 9:
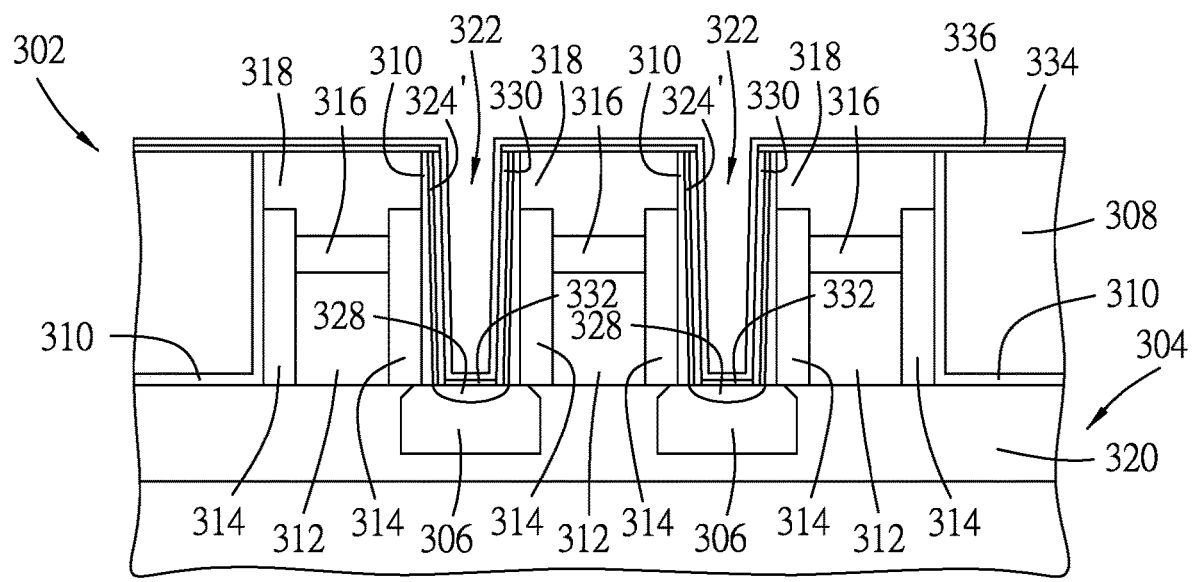

Referring to FIG. 1, in a step 212 of the method 200, a protection layer is formed. Referring to FIG. 9, the protection layer 336 (also referred to as a conductive liner layer) is formed on and covers the metal nitride layer 334, the insulating layers 330 and the capping layers 332. In some embodiments, the protection layer 336 may be made of a metal nitride material, where the metal includes Ru, Co, Ti, Ni, Mo, Pt, Ta, W, Cr, Zr, Ir, Rh, Os, other suitable materials, or any combination thereof. In some embodiments, the protection layer 336 may be formed by ALD, CVD, PVD, other suitable techniques, or any combination thereof.

Referring to FIG. 1, in a step 214 of the method 200, the protection layer is cleaned. Referring to FIG. 9, after the formation of the protection layer 336, the protection layer 336 may be oxidized at a surface thereof. The oxidized protection layer 336 is then subjected to a cleaning process to, for example, remove oxygen from the oxidized surface of the protection layer 336. In some embodiments, the protection layer 336 may be cleaned by using a halogen-containing gas, such as fluorine-containing gas, chlorine-containing gas, other suitable types of chemicals, or any combination thereof. In some embodiments, the halogen-containing gas may include $WF_6$, $BCl_3$, $MoCl_5$, $MoO_2Cl_2$, other suitable types of chemicals, or any combination thereof. In some embodiments, the protection layer 336 may be first etched by $WF_6$ under a temperature ranging from about 300° C. to about 500° C., but other ranges of values are also within the scope of this disclosure, and under a pressure ranging from about 1 torr to about 5 torr, but other ranges of values are also within the scope of this disclosure. In some embodiments, the rate of etching the oxidized surface of the protection layer 336 using $WF_6$ may range from about 0.1 Å/sec to about 0.5 Å/sec, from about 0.1 Å/sec to about 0.25 Å/sec, from about 0.25 Å/sec to about 0.5 Å/sec, or may be in other suitable ranges, depending on process conditions and practical requirements. In some embodiments, if the temperature of $WF_6$ is too low, such as lower than about 300° C., the rate of etching the oxidized surface of the protection layer 336 may be slower. In some embodiments, if the temperature of $WF_6$ is too high, such as higher than about 500° C., the protection layer 336 may be over etched and/or oxidized. In some embodiments, if the pressure of $WF_6$ is too low, such as lower than about 1 torr, the rate of etching the oxidized surface of the protection layer 336 may be slower. In some embodiments, if the pressure of $WF_6$ is too high, such as higher than about 5 torr, the rate of etching the oxidized surface of the protection layer 336 may be higher, which may result in over etching the protection layer 336. In some embodiments, after the etching using $WF_6$, a hydrogen-containing plasma (e.g., $H_2$ plasma) may be applied to the protection layer 336 for purposes, such as removing at least some of the tungsten and/or fluorine residues on the protection layer 336, under a temperature ranging from about 30° C. to about 450° C. but other ranges of values are also within the scope of this disclosure, under a pressure ranging from about 100 mini-torr to about 20 torr but other ranges of values are also within the scope of this disclosure, and under a radio frequency power ranging from about 200 watts to about 800 watts but other ranges of values are also within the scope of this disclosure. In some embodiments, if the temperature of the hydrogen-containing plasma is too low, such as lower than about 30° C., the reaction rate between the hydrogen-containing plasma and the residues may be slower. In some embodiments, if the temperature of the hydrogen-containing plasma is too high, such as higher than about 450° C., the protection layer 336 may be oxidized. In some embodiments, after the treatment with hydrogen-containing plasma, the protection layer 336 may be etched by $BCl_3$ or a combination of $WF_6$ and $BCl_3$ under a temperature ranging from about 300° C. to about 500° C. and under a pressure ranging from about 1 torr to about 5 torr for further cleaning the surface of the protection layer 336, but other temperature and pressure values are also within the scope of this disclosure. In some embodiments, if the temperature of $BCl_3$ etching is too low, such as lower than about 300° C., the rate of etching may be lower. In some embodiments, if the temperature of $BCl_3$ etching is too high, such as higher than about 500° C., the protection layer 336 may be over etched and/or oxidized. In other embodiments, $WF_6$ may be replaced with $MoCl_5$ with the same process conditions or any necessary adjustments according to practical requirements. In some embodiments, when $MoCl_5$ is used for etching, the temperature of $MoCl_5$ may range from about 80° C. to about 250° C., from about 80° C. to about 100° C., from about 100° C. to about 125° C., from about 125° C. to about 140° C., from about 140° C. to about 200° C., from about 200° C. to about 250° C., or it may be in other suitable ranges. In some embodiments, if the temperature of $MoCl_5$ is too low, such as lower than about 80° C., the rate of etching may be lower. In some embodiments, if the temperature of $MoCl_5$ is too high, such as higher than about 250° C., the protection layer 336 may be over etched and/or oxidized.

Figure 10:
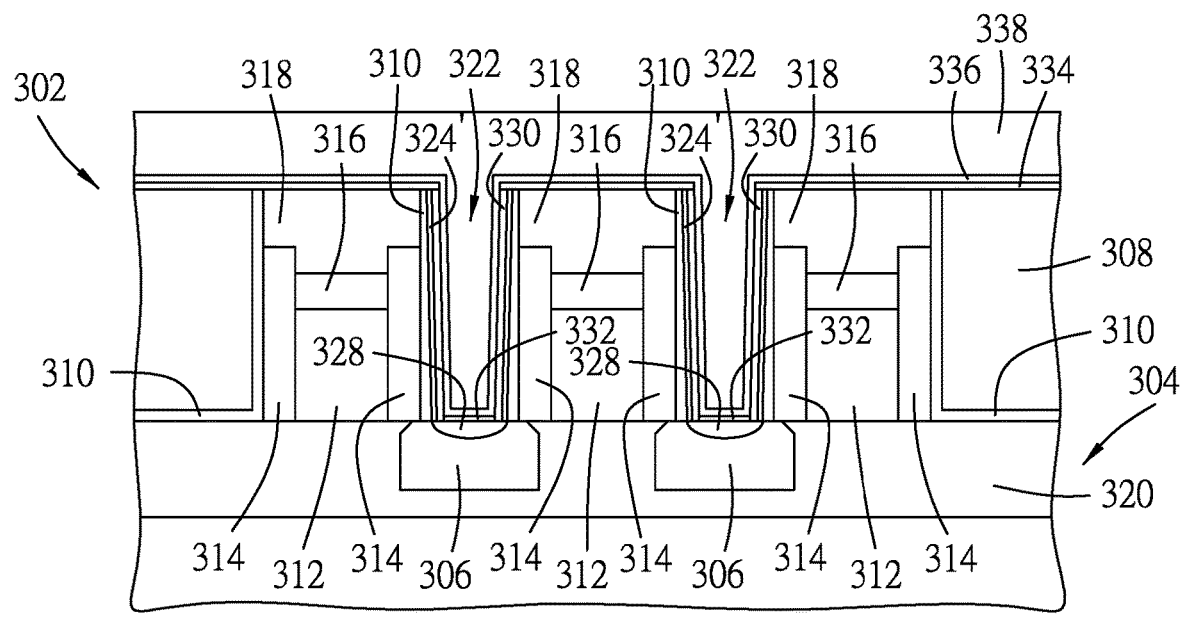

Referring to FIG. 1, in a step 216 of the method 200, a plurality of conductive structures are formed. Referring to FIG. 10, in some embodiments, a conductive layer 338 is formed over the semiconductor structure 302 and is formed to fill the source/drain contact openings 322 (see FIG. 9). Afterwards, referring to FIGS. 10 and 11, a top portion of the conductive layer 338 is removed by dry etching, chemical mechanical planarization (CMP), other suitable techniques, or any combination thereof, to form a plurality of the conductive structures 338' respectively in the source/drain contact openings 322 (see FIG. 9). In addition, during the removing process, the metal nitride layer 334 is removed, and a top portion of the protection layer 336 is removed to form a plurality of protection segments 336' (or may be referred to as conductive liner segments 336'), where each of the protection segments 336' surrounds a respective one of the conductive structures 338' and is disposed over a respective one of the silicide structures 328. The semiconductor device 300 is thus obtained.

In some embodiments, the conductive layer 338 (i.e., the conductive structures 338') may be made of Ru, Co, Ti, Ni, Mo, Ni, Pt, Ta, W, Cr, Zr, Ir, Rh, Os, other suitable materials, or any combination thereof, and may be made by CVD, ALD, PVD, other suitable techniques, or any combination thereof. In some embodiments, the conductive layer 338 is exemplified to be made by an oxygen-containing process, such as CVD, where the protection segments 336' may serve as a protection, so that the silicide structures 328 are less likely to be oxidized or, in other embodiments, the oxygen content of the silicide structures 328 is lowered after the process of forming the conductive layer 338. In some embodiments, the conductive layer 338 (i.e., the conductive structures 338') is exemplified to be made of Ru, where a precursor of Ru may include diethylruthenocene (i.e., $Ru(EtCp)_2$), $Ru(DMBD)(CO)_3$, EBECH-Ru, $RuCp_2$, dodecacarbonyl triruthenium (i.e., DCR), $CpRu(CO)_2Et$, CHORUS, $CO_2(CO_6)[HCC(C(CH3)_3)]$, $Ru_3(CO)_{12}$, other suitable materials, or any combination thereof, and carrier gas for carrying the precursor may include $O_2$, $H_2O$, $O_3$, $NH_3$, Ar, other suitable types of gas, or any combination thereof. In some embodiments, the ruthenium precursors may react with $O_2$, $H_2O$, other suitable chemicals, or any combination thereof to form the conductive layer 338. In some embodiments, the conductive layer 338 (i.e., the conductive structures 338') is exemplified to be made of Mo, where precursors of Mo may be $MoO_2Cl_2$, other suitable materials, or any combination thereof. In some embodiments, the conductive layer 338 may be formed under a temperature ranging from about 100° C. to about 400° C., but other ranges of values are also within the scope of this disclosure. In some embodiments, if the reaction temperature is too low, such as lower than about 100° C., the deposition rate of the conductive layer 338 may be slower. In some embodiments, if the reaction temperature is too high, such as higher than about 400° C., the conductive layer 338 may be oxidized. In some embodiments, the reaction of the precursor may be plasma-assisted with a plasma power not greater than about 2000 W, but other ranges of values are also within the scope of this disclosure. In some embodiments, if the power of the plasma is too high, such as higher than about 2000 W, the conductive layer 338 may be damaged.

In some embodiments, each of the silicide structures 328 may have, with the protection from a respective one of the protection segments 336', an oxygen content not greater than about 3% (e.g., in atomic concentration). In some embodiments, with the protection segments 336', each of the silicide structures 328 may have an oxygen content ranging from about 1% to 3%, from about 1% to about 1.2%, from about 1.2% to about 1.5%, from about 1.5% to about 1.8%, from about 1.8% to about 2.0%, from about 2.0% to about 2.2%, from about 2.2% to about 2.5%, from about 2.5% to about 2.7%, from about 2.7% to about 3%, or may be in other suitable ranges. In some embodiments, if the oxygen content of each of the silicide structures 328 is too large, such as greater than about 3%, the overall resistance of the semiconductor device 300 may be increased (which may be due to an increase in contact resistance ($R_{csd}$)), adversely affecting performance of the semiconductor device 300. In some embodiments, the oxygen content may be measured by x-ray photoelectron spectroscopy (XPS), or other suitable pieces of equipment. In some embodiments, each of the protection segments 336' may have a thickness ranging from about 0.5 nm to about 4 nm, but other ranges of values are also within the scope of this disclosure. In some embodiments, if the thickness of each of the protection segments 336' is too thin, such as less than about 0.5 nm, the protection segments 336' may not be able to protect the silicide structures 328 from oxidation. In some embodiments, if the thickness of each of the protection segments 336' is too thick, such as greater than about 4 nm, the overall resistance of the semiconductor device 300 may be increased, and the conductive structures 338' may not properly fill into the source/drain contact openings 322 (see FIG. 9) due to the thicker protection segments 336' causing the source/drain contact openings 322 to decrease in dimension. In some embodiments, the oxygen from the process of forming the conductive structures 338' may accumulate at the interface between each of the conductive structures 338' and a respective one of the protection segments 336', where the oxygen content at the interface may be not greater than about 6%. In some embodiments, the oxygen content at the interface between each of the conductive structures 338' and the respective one of the protection segments 336' may range from about 1% to about 2%, from about 2% to about 3%, from about 3% to about 4%, from about 4% to about 5%, from about 5% to about 6%, or may be in other suitable ranges. If the oxygen content at the interface between each of the conductive structures 338' and the respective one of the protection segments 336' is too high, such as higher than about 6%, the overall resistance of the semiconductor device 300 may be increased, and adversely affect performance of the semiconductor device 300. In some embodiments, residues from the process of cleaning the protection layer 336 may be left at the interface between the between each of the conductive structures 338' and the respective one of the protection segments 336'. In some embodiments, the residues may include W, Mo, F, Cl, other materials, or any combination thereof, and the residues may be not greater than about 5%, may range from about 1% to about 2%, from about 2% to about 3%, from about 3% to about 4%, from about 4% to about 5%, or may be in other suitable ranges. If the residue content is too high, such as higher than about 5%, the overall resistance of the semiconductor device 300 may be increased, adversely affecting performance of the semiconductor device 300.

Figure 11:
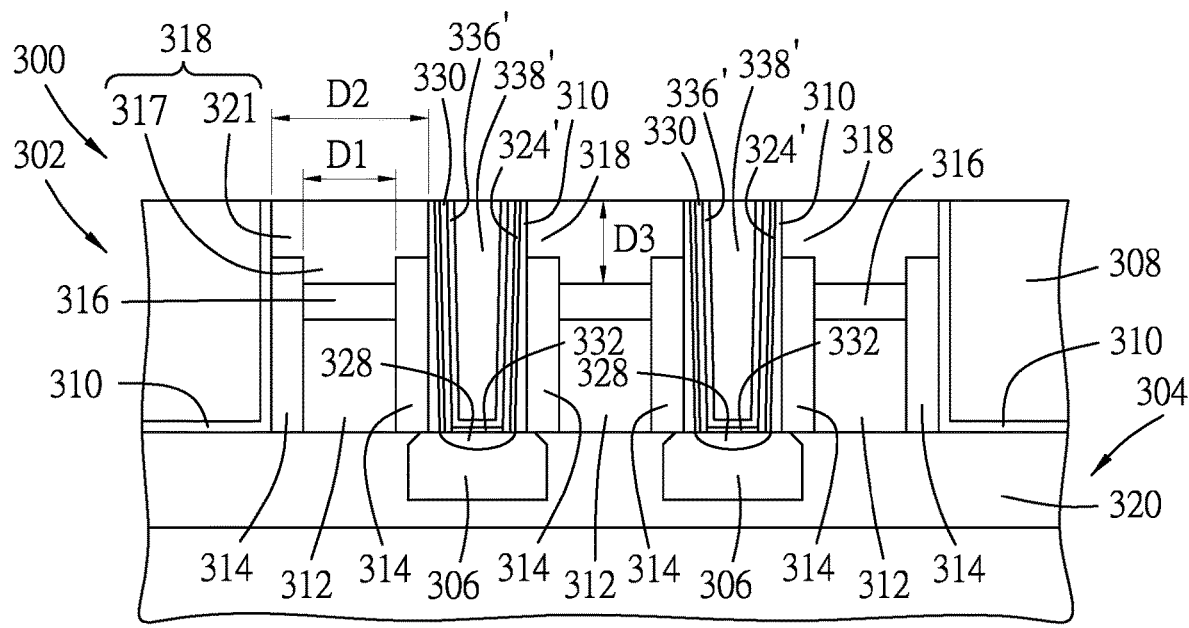

Referring to FIG. 11, in some embodiments, each of the hard masks 318 may include a first portion 317 and a second portion 321 disposed on the first portion 317, where the first portion 317 may have a width (D1) ranging from about 1 nm to about 30 nm but other ranges of values are also within the scope of this disclosure, and the second portion 321 may have a width (D2) ranging from about 1 nm to about 50 nm but other ranges of values are also within the scope of this disclosure. In some embodiments, one of the first portion 317 and the second portion 321 of each of the hard masks 318 may be omitted according to practical requirements. In some embodiments, each of the hard masks 318 may have a thickness (D3) ranging from about 2 nm to about 50 nm, but other ranges of values are also within the scope of this disclosure.

Figure 12:
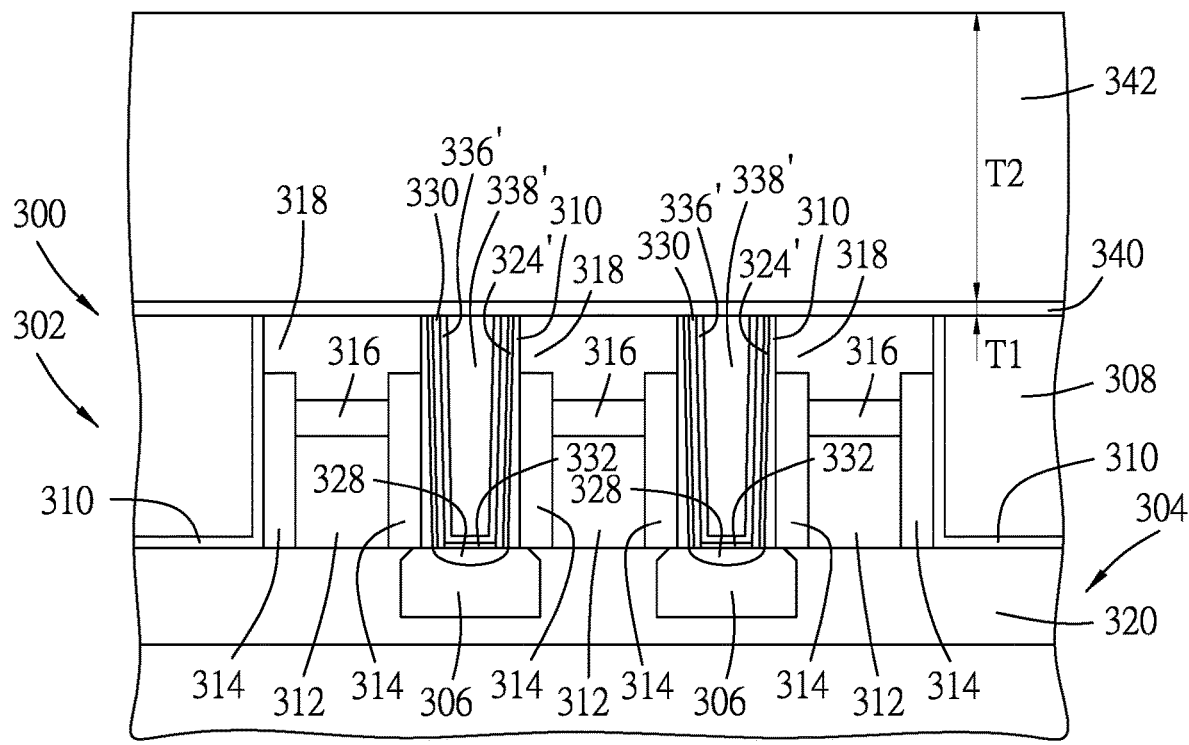
FIGS. 12 to 15 show intermediate steps of manufacturing a contact feature over a semiconductor device.

Referring to FIG. 12, in some embodiments where the semiconductor device 300 is formed, an etch stop layer 340 may be formed over the semiconductor device 300, followed by forming a dielectric layer 342 over the etch stop layer 340. In some embodiments, the etch stop layer 340 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, the etch stop layer 340 may be made by CVD, ALD, PVD, other suitable techniques, or any combination thereof. In some embodiments, the dielectric layer 342 may be made of LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, the dielectric layer 342 may be made by CVD, ALD, PVD, other suitable techniques, or any combination thereof. In some embodiments, the etch stop layer 340 has a thickness (T1) that may range from about 3 nm to about 20 nm, but other ranges of values are also within the scope of this disclosure. In some embodiments, if the thickness (T1) of the etch stop layer 340 is too thin, such as smaller than about 3 nm, the etch stop layer 340 may not be able to serve as an etch stop layer for the subsequent etching of the contact opening. In some embodiments, if the thickness (T1) of the etch stop layer 340 is too thick, such as greater than about 20 nm, the subsequently obtained device may have a high RC constant, leading to deteriorating device performance. In some embodiments, the dielectric layer 342 may have a thickness (T2) ranging from about 3 nm to about 40 nm, but other ranges of values are also within the scope of this disclosure. In some embodiments, if the thickness (T2) of the dielectric layer 342 is too thin, such as smaller than about 3 nm, the subsequently formed contacts may have small volume, leading to high resistance of the contacts. In some embodiments, if the thickness (T2) of the dielectric layer 342 is too thick, such as greater than about 40 nm, the subsequent formed contact openings may have high aspect ratio, making it more difficult to form the contacts therein.

Figure 13:
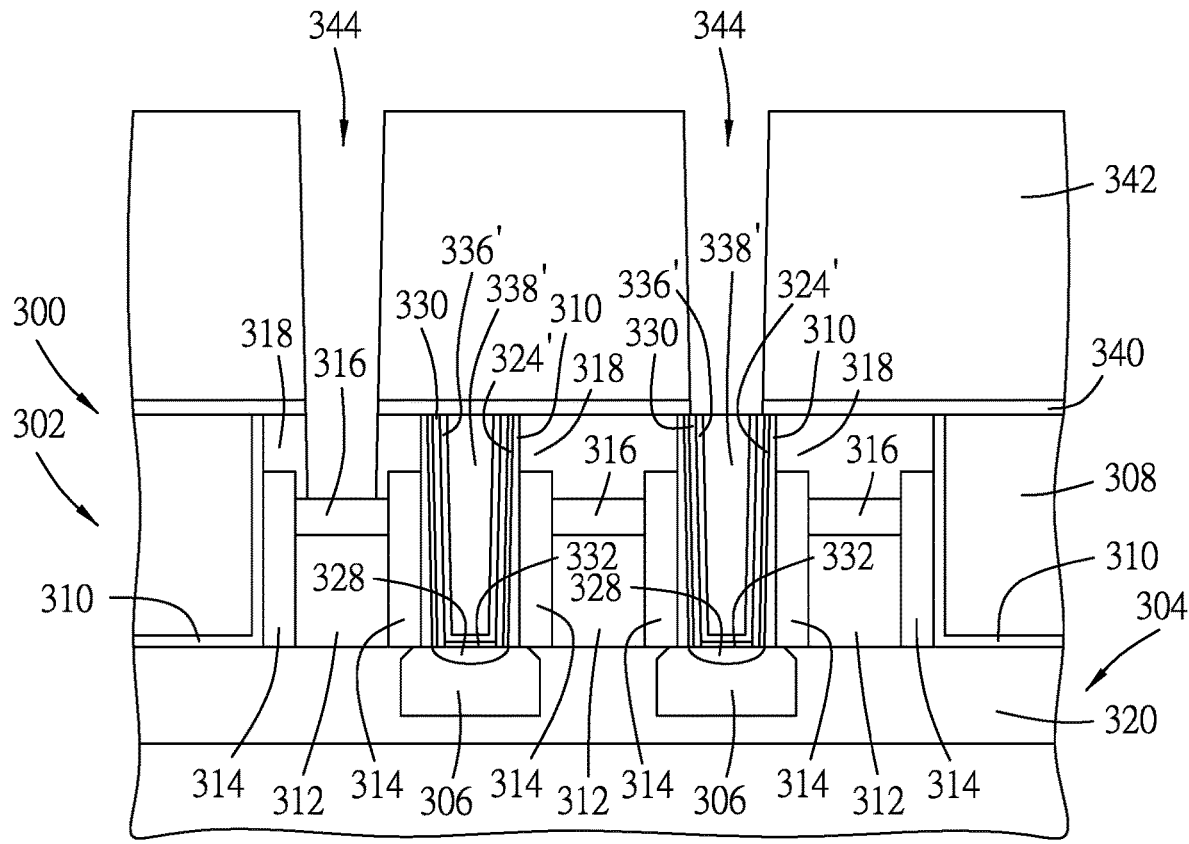

Referring to FIG. 13, in some embodiments after the formation of the etch stop layer 340 and the dielectric layer 342, a plurality of contact openings 344 are formed to penetrate the etch stop layer 340 and the dielectric layer 342. FIG. 13 exemplarily shows two contact openings 344, one of which further penetrates a corresponding one of the hard masks 318 and exposes a corresponding one of the conductive features 316, and the other one of which exposes a corresponding one of the conductive structures 338'. The number and location of the contact openings 344 may be changed according to practical requirements.

Figure 14:
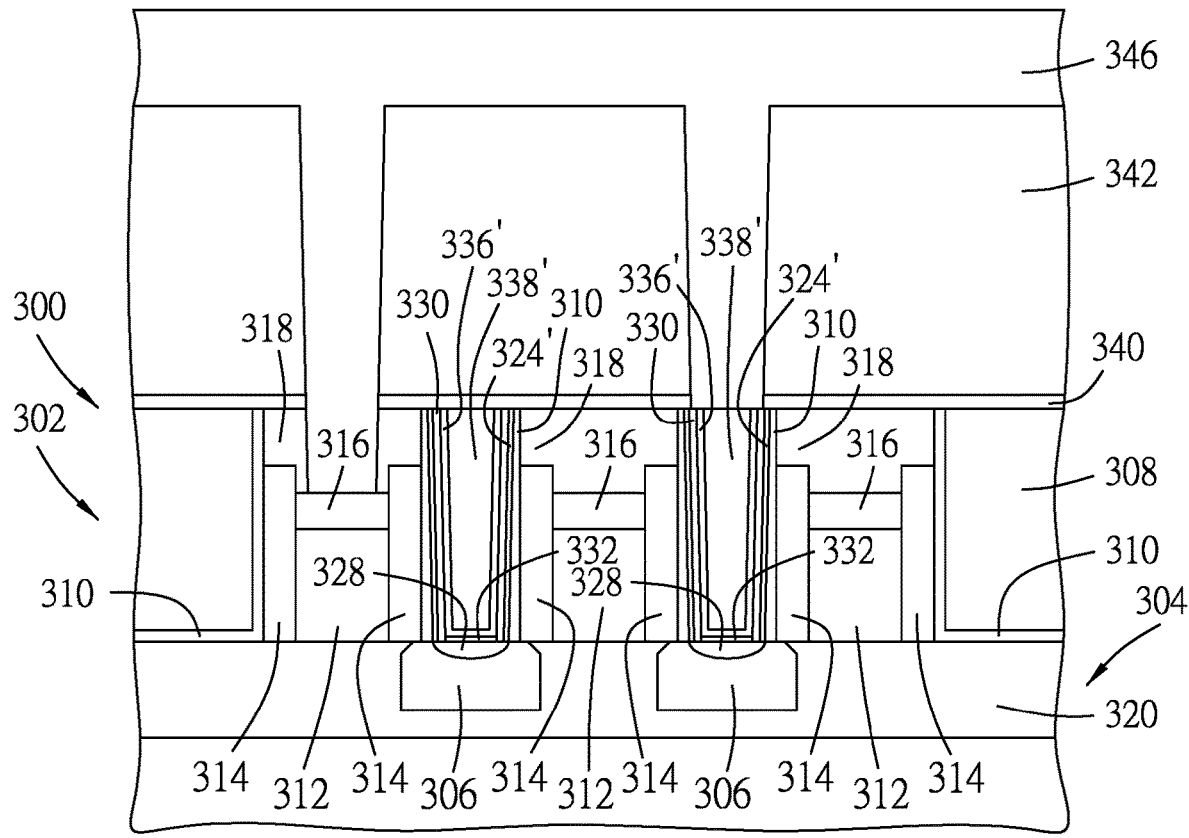

Referring to FIG. 14, in some embodiments after the contact openings 344 (see FIG. 13) are formed, a contact layer 346 is formed over the dielectric layer 342 and is formed to fill the contact openings 344. In some embodiments, the contact layer 346 may be made of W, Ru, Al, Mo, Ti, TiN, TiSi, CoSi, NiSi, Cu, TaN, Co, other suitable materials, or any combination thereof. In some embodiments, the contact layer 346 may be formed by CVD, ALD, PVD, plating (including electroplating, electroless plating, etc.), other suitable techniques, or any combination thereof.

Figure 15:
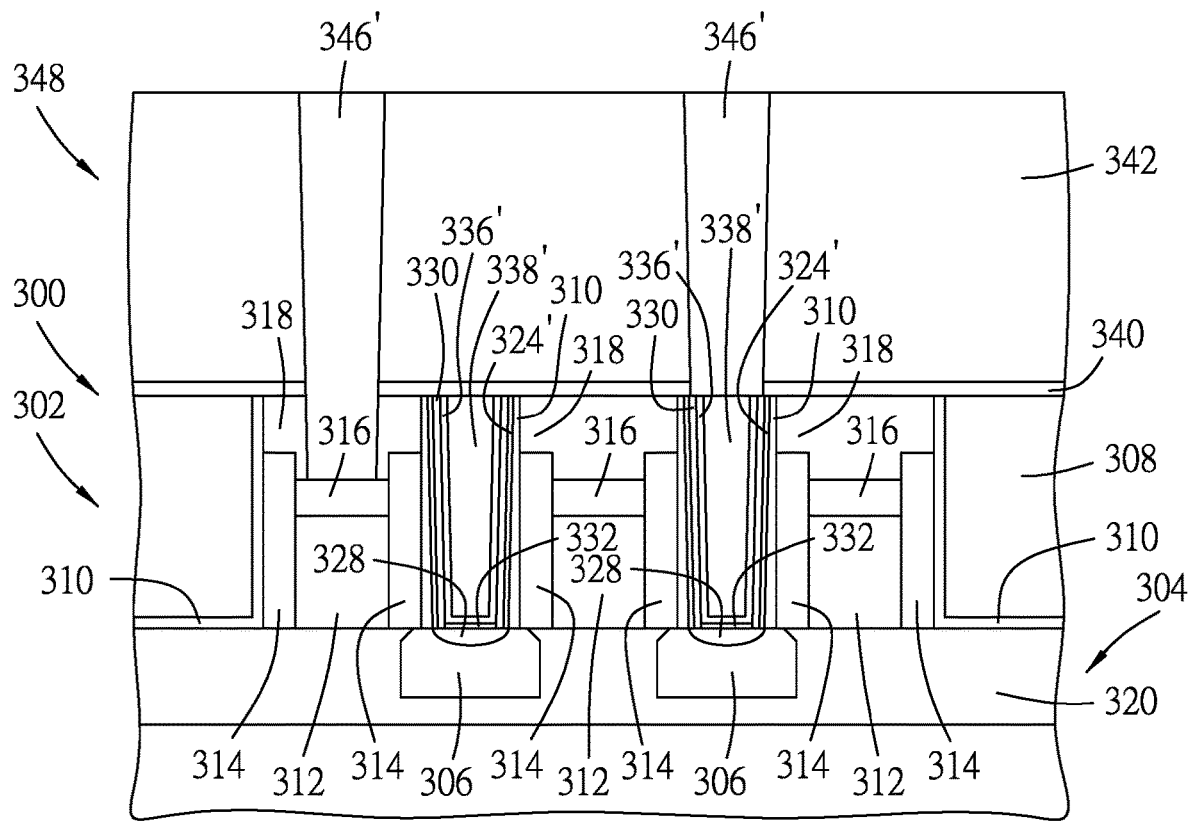

Referring to FIG. 15, in some embodiments after the formation of the contact layer 346, a top portion of the contact layer 346 is removed to form a plurality of contact structures 346' respectively in the contact openings 344 (see FIG. 13), thereby obtaining a contact feature 348 that is disposed over the semiconductor device 300. In some embodiments, each of the contact structures 346' may be provided with a glue layer (not shown), according to practical requirements.

Figure 16:
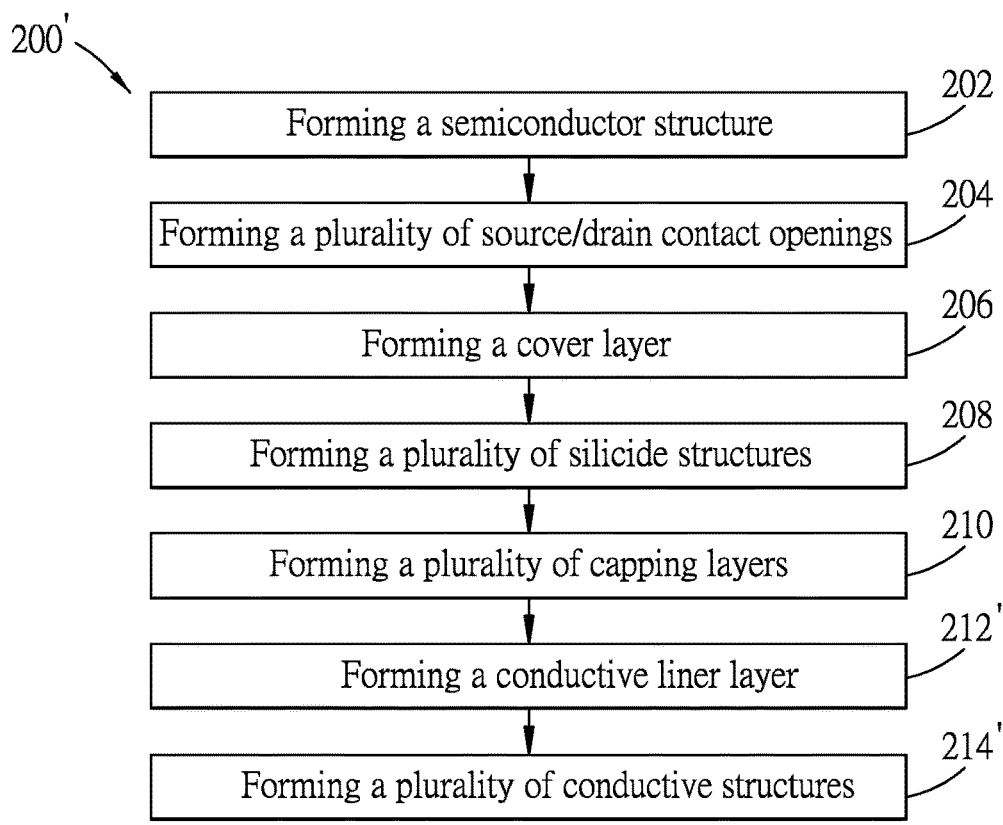
FIG. 16 is a flow chart showing a method of manufacturing a semiconductor device.
Figure 17:
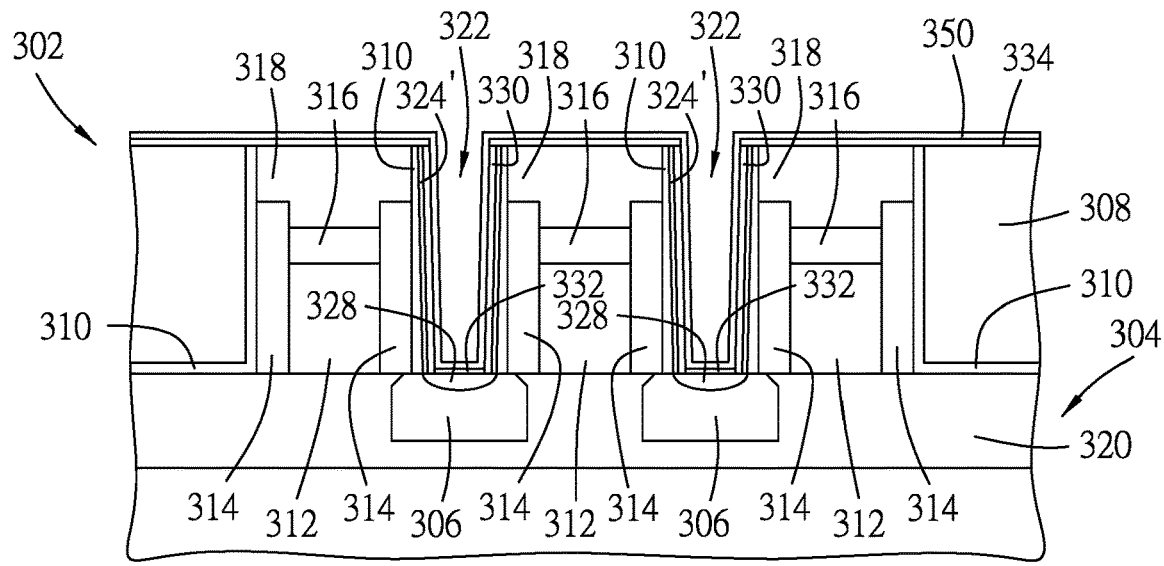
FIGS. 17 to 19 show intermediate steps of a method of manufacturing a semiconductor device.

Referring to FIG. 16, in a method 200' of forming a semiconductor device 300' (see FIG. 19), steps 202 to 210 are identical to those described above or may be modified according to practical requirements. In a step 212' of the method 200', a conductive liner layer is formed. Referring to FIGS. 16 and 17, after the step 210 of forming the capping layers 332 (as illustrated by FIG. 8), the conductive liner layer 350 is formed on and covers the metal nitride layer 334, the insulating layers 330 and the capping layers 332. In some embodiments, the conductive liner layer 350 may be made of Ru, Co, Ti, Ni, Mo, Pt, Ta, W, Cr, Zr, Ir, Rh, Os, other suitable materials, or any combination thereof. In some embodiments, the conductive liner layer 350 may be made by an oxygen-free technique, such as ALD, CVD (including thermal CVD, plasma-enhanced CVD (PECVD), etc.) other suitable techniques, or any combination thereof. In some embodiments, precursors and reactants used for forming the conductive liner layer 350 may be oxygen-free.

In some embodiments, the conductive liner layer 350 is exemplified to be made of Ru, and is exemplified to be made by ALD. In some embodiments, the precursor for forming the conductive liner layer 350 may be $RuCp_2$, $Ru(EtCp)_2$), EBECH-Ru, other suitable precursors, or any combination thereof. In some embodiments, the precursor may react with a reactant including $MeN_2H_2$ (Me being a transition element, or other suitable elements), t-$BuNH_2$ (tert-Butylamine), $NH_3$, $N_2H_4$, other suitable reactants, or any combination thereof, to form the conductive liner layer 350. In some embodiments, the reaction temperature of the precursor and the reactant may range from about 200° C. to about 400° C., but other ranges of values are also within the scope of this disclosure. In some embodiments, if the reaction temperature is too low, such as lower than about 200° C., the deposition rate of the conductive liner layer 350 may be slower and carbon residue from the precursor may increase. In some embodiments, if the reaction temperature is too high, such as higher than about 400° C., the conductive liner layer 350 may be oxidized. In some embodiments, the reaction between the precursor and the reactant may be plasma-assisted with a plasma power not greater than about 2000 W, but other ranges of values are also within the scope of this disclosure. In some embodiments, if the plasma power is too high, such as higher than about 2000 W, the conductive liner layer 350 may be damaged. In some embodiments, when the conductive liner layer 350 is exemplified to be deposited by ALD, the precursor may be introduced into a reaction chamber for a period ranging from about 0.5 second to about 20 seconds, but other ranges of values are also within the scope of this disclosure, followed by introducing the reactant into the reaction chamber for a period ranging from about 0.5 second to about 20 seconds, but other ranges of values are also within the scope of this disclosure. In some embodiments, if the introduction time of each of the precursor and the reactant is too low, such as lower than about 0.5 second, nucleation of the conductive liner layer 350 may not occur. In some embodiments, if the introduction time of each of the precursor and the reactant is too high, such as higher than about 20 seconds, the resulting conductive liner layer 350 may have an undesirably high roughness and the throughput of the manufacturing process may be lowered. In some embodiments, the flow rate of the reactant may range from about 20 sccm to about 1000 sccm, but other ranges of values are also within the scope of this disclosure. In some embodiments, if the flow rate of the reactant is too low, such as lower than about 20 sccm, nucleation of the conductive liner layer 350 may not occur. In some embodiments, if the flow rate of the reactant is too high, such as higher than about 1000 sccm, the resulting conductive liner layer 350 may have an undesirably high roughness. In some embodiments, the conductive liner layer 350 may be formed under a deposition rate ranging from about 0.1 Å/cycle to about 5 Å/cycle, but other ranges of values are also possible according to different process conditions.

Figure 18:
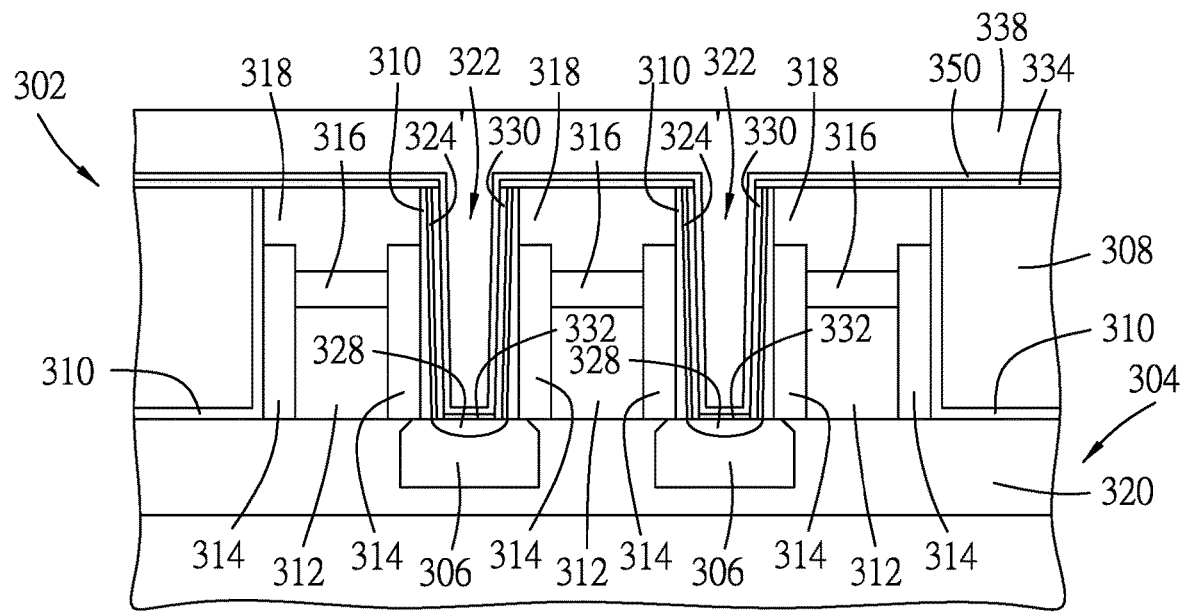

Referring to FIG. 16, in a step 214', a plurality of conductive structures are formed. Referring to FIG. 18, in some embodiments, the conductive layer 338 is formed over the semiconductor structure 302 and is formed to fill the source/drain contact openings 322 (see FIG. 17). Afterwards, referring to FIGS. 18 and 19, a top portion of the conductive layer 338 is removed by dry etching, CMP, other suitable techniques, or any combination thereof, to form a plurality of the conductive structures 338' respectively in the source/drain contact openings 322 (see FIG. 17). In addition, during the removing process, the metal nitride layer 334 is removed, and a top portion of the conductive liner layer 350 is removed to form a plurality of conductive liner segments 350', where each of the conductive liner segments 350' surrounds a respective one of the conductive structures 338' and is disposed over a respective one of the silicide structures 328. The semiconductor device 300' is thus obtained.

Figure 19:
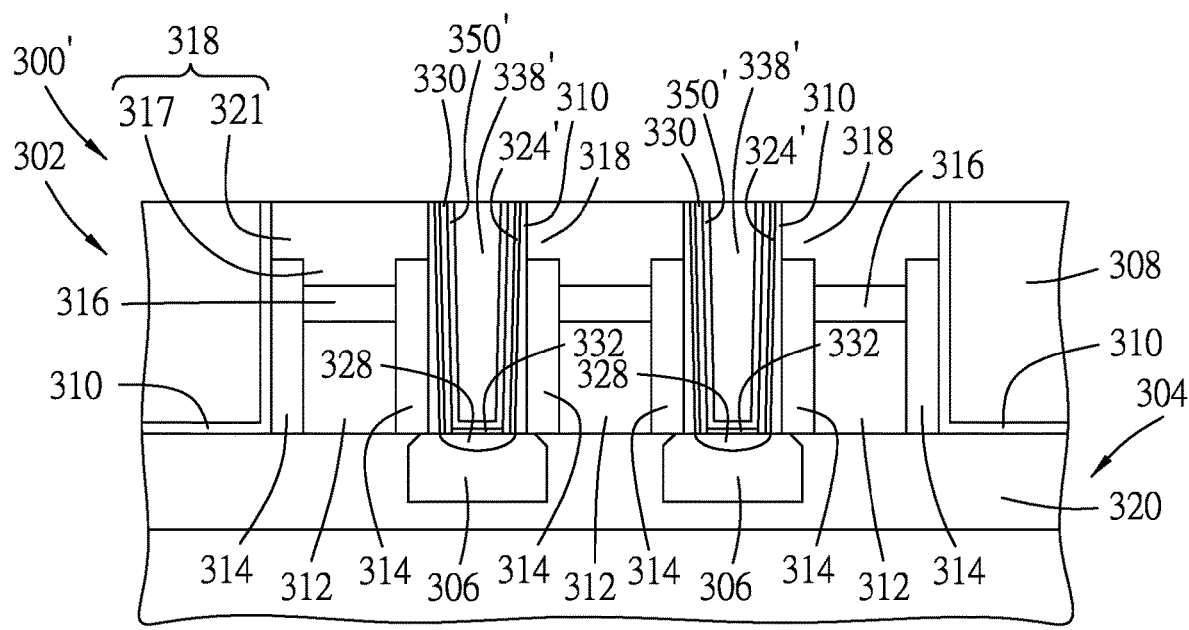

Referring to FIG. 19, in some embodiments, since the conductive liner layer 350 (i.e., the conductive liner segments 350') is made by an oxygen-free technique before forming the conductive layer 338 (i.e., the conductive structures 338'), the silicide structures 328 are less likely to be oxidized or, in other embodiments, the oxygen content of the silicide structures 328 is lowered after the process of forming the conductive layer 338. In some embodiments, carbon may be detected in the conductive liner segments 350', and each of the conductive liner segments 350' may have a carbon content (may be measured by XPS or other suitable pieces of equipment) not greater than about 25%. In some embodiments, if the carbon content of each of the conductive liner segments 350' is too high, such as higher than about 25%, the resistivity of the conductive liner segments 350' may be higher. In some embodiments, the resistivity of each of the conductive structures 338' may be not greater than about 50 µΩ-cm, but other ranges of values are also within the scope of this disclosure. In some embodiments, the resistivity of each of the conductive structures 338' may range from about 15 µΩ-cm to about 50 µΩ-cm, from about 15 µΩ-cm to about 20 µΩ-cm, from about 20 µΩ-cm to about 25 µΩ-cm, from about 25 µΩ-cm to about 30 µΩ-cm, from about 30 µΩ-cm to about 35 µΩ-cm, from about 35 µΩ-cm to about 40 µΩ-cm, from about 40 µΩ-cm to about 45 µΩ-cm, from about 45 µΩ-cm to about 50 µΩ-cm, or may be in other suitable ranges. In some embodiments, if the resistivity of each of the conductive structures 338' is too high, such as higher than about 50 µΩ-cm, the overall resistance of the semiconductor device 300' may be increased. In some embodiments, the resistivity of each of the conductive liner segments 350' may range from about 60 µΩ-cm to about 125 µΩ-cm, from about 60 µΩ-cm to about 65 µΩ-cm, from about 65 µΩ-cm to about 70 µΩ-cm, from about 70 µΩ-cm to about 75 µΩ-cm, from about 75 µΩ-cm to about 80 µΩ-cm, from about 80 µΩ-cm to about 85 µΩ-cm, from about 85 µΩ-cm to about 90 µΩ-cm, from about 90 µΩ-cm to about 95 µΩ-cm, from about 95 µΩ-cm to about 100 µΩ-cm, from about 100 pf-cm to about 105 µΩ-cm, from about 105 µΩ-cm to about 110 µΩ-cm, from about 110 µΩ-cm to about 115 µΩ-cm, from about 115 µΩ-cm to about 120 µΩ-cm, from about 120 µΩ-cm to about 125 µΩ-cm, or may be in other suitable ranges. In some embodiments, if the resistivity of each of the conductive liner segments 350' is too high, such as higher than about 125 µΩ-cm, the overall resistance of the semiconductor device 300' may be increased. In some embodiments, the resistivity of each of the conductive liner segments 350' is at least 20% higher than the resistivity of each of the conductive structures 338'. In some embodiments, the average grain size of each of the conductive liner segments 350' may be smaller than that of each of the conductive structures 338'. In some embodiments, the percentage of impurities in each of the conductive liner segments 350' may be greater than that of each of the conductive structures 338'. In some embodiments, each of the conductive structures 338' and each of the conductive liner segments 350' are made of the same material.

Figure 20:
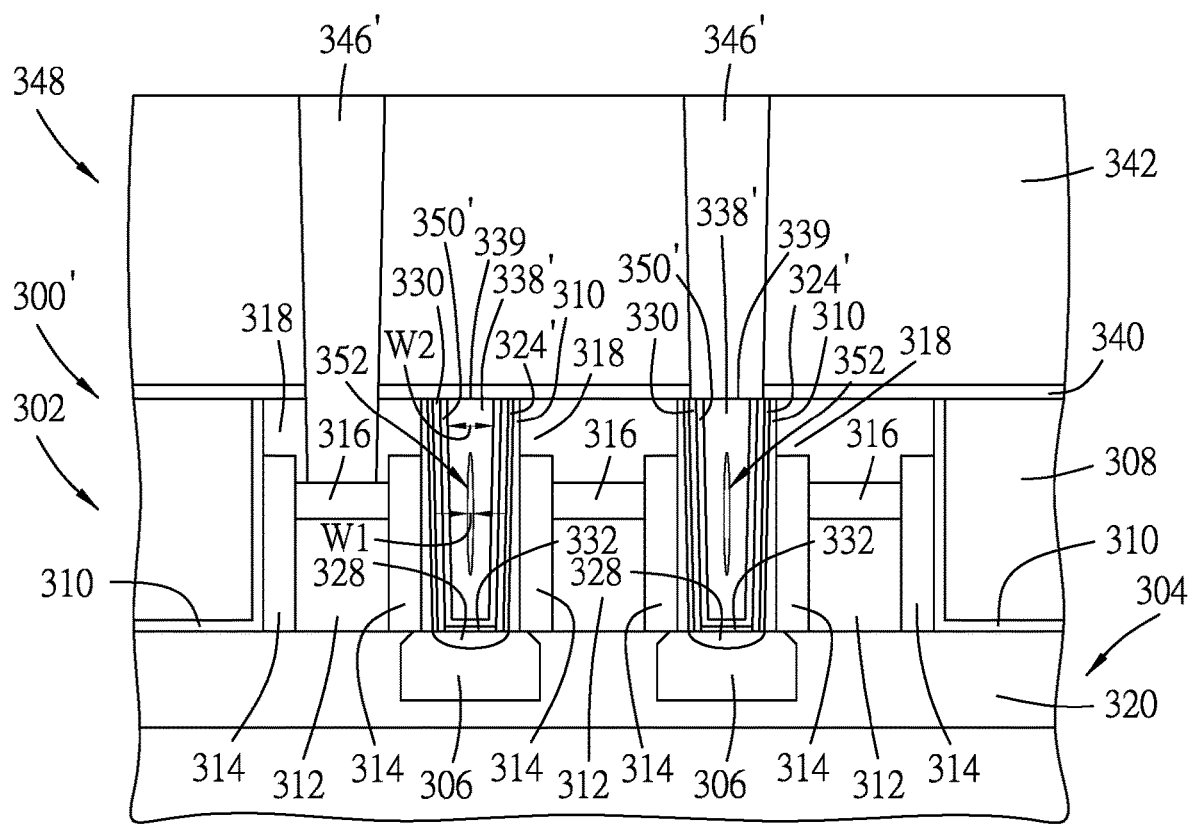
FIG. 20 shows a contact feature formed over a semiconductor device.

FIG. 20 is a schematic view showing that the contact feature 348 is formed over the semiconductor device 300'. In some embodiments, at least one seam 352 may be formed in a corresponding one of the conductive structures 338'. FIG. 20 schematically shows that a plurality of seams 352 are respectively formed in the conductive structures 338'. In some embodiments, each of the seams 352 is located at a position below an upper surface 339 of the respective one of the conductive structures 338', and is surrounded by a respective one of the conductive liner segments 350'. In some embodiments, each of the seams 352 may have a width (W1) that is about 10% to about 40% of a width (W2) of the respective one of the conductive structures 338'. In some embodiments, the width (W1) of each of the seams 352 may be about 10% to about 15% of the width (W2) of the respective one of the conductive structures 338'. In some embodiments, the width (W1) of each of the seams 352 may be about 15% to about 20% of the width (W2) of the respective one of the conductive structures 338'. In some embodiments, the width (W1) of each of the seams 352 may be about 20% to about 25% of the width (W2) of the respective one of the conductive structures 338'. In some embodiments, the width (W1) of each of the seams 352 may be about 25% to about 30% of the width (W2) of the respective one of the conductive structures 338'. In some embodiments, the width (W1) of each of the seams 352 may be about 30% to about 35% of the width (W2) of the respective one of the conductive structures 338'. In some embodiments, the width (W1) of each of the seams 352 may be about 35% to about 40% of the width (W2) of the respective one of the conductive structures 338', or may be in other suitable percentage ranges. In some embodiments, if the width (W1) of each of the seams 352 is too large, such as greater than about 40% of the width (W2) of the respective one of the conductive structures 338', the respective one of the conductive structures 338' may have an undesirably high resistivity. In some embodiments, the conductive structures 338' are free of the seams 352.

Referring to FIG. 20, in some embodiments, each of the silicide structures 328 may have an oxygen content not greater than about 3% with the conductive liner segments 350' formed prior to the formation of the conductive structures 338'. In some embodiments, with the conductive liner segments 350', each of the silicide structures 328 may have an oxygen content ranging from about 1% to 3%, from about 1% to about 1.2%, from about 1.2% to about 1.5%, from about 1.5% to about 1.8%, from about 1.8% to about 2.0%, from about 2.0% to about 2.2%, from about 2.2% to about 2.5%, from about 2.5% to about 2.7%, from about 2.7% to about 3%, or may be in other suitable ranges. In some embodiments, if the oxygen content of each of the silicide structures 328 is too large, such as greater than about 3%, the overall resistance of the semiconductor device 300' may be increased (which may be due to an increase in contact resistance ($R_{csd}$)), adversely affecting performance of the semiconductor device 300'. In some embodiments, the oxygen content may be measured by x-ray photoelectron spectroscopy (XPS), or other suitable pieces of equipment. In some embodiments, each of the conductive liner segments 350' may have a thickness ranging from about 0.5 nm to about 4 nm, but other ranges of values are also within the scope of this disclosure. In some embodiments, if the thickness of each of the conductive liner segments 350' is too thin, such as less than about 0.5 nm, the silicide structures 328 may be oxidized during the process of forming the conductive structures 338'. In some embodiments, if the thickness of each of the conductive liner segments 350' is too thick, such as greater than about 4 nm, the overall resistance of the semiconductor device 300' may be increased, and the conductive structures 338' may not properly fill into the source/drain contact openings 322 (see FIG. 17) due to the thicker conductive liner segments 350' causing the source/drain contact openings 322 to decrease in dimension. In some embodiments, the oxygen from the process of forming the conductive structures 338' may accumulate at the interface between each of the conductive structures 338' and a respective one of the conductive liner segments 350', where the oxygen content at the interface may not be greater than about 6%. In some embodiments, the oxygen content at the interface between each of the conductive structures 338' and the respective one of the conductive liner segments 350' may range from about 1% to about 2%, from about 2% to about 3%, from about 3% to about 4%, from about 4% to about 5%, from about 5% to about 6%, or may be in other suitable ranges. If the oxygen content at the interface between each of the conductive structures 338' and the respective one of the conductive liner segments 350' is too high, such as higher than about 6%, the overall resistance of the semiconductor device 300' may be increased, adversely affecting performance of the semiconductor device 300'.

The embodiments of the present disclosure have some advantageous features. With the protection layer 336 (i.e., the protection segments 336') or the conductive liner layer 350 (i.e., the conductive liner segments 350'), oxidation of the silicide structures 328 cause by, for example, the forming of the conductive layer 338 (i.e., the conductive structures 338') may be prevented or minimized.

In accordance with some embodiments of the present disclosure, a semiconductor device includes a semiconductor substrate, an epitaxial structure, a silicide structure, a conductive structure, and a protection segment. The epitaxial structure is disposed in the semiconductor substrate. The silicide structure is disposed in the epitaxial structure. The conductive structure is disposed over the silicide structure and is electrically connected to the silicide structure. The protection segment is made of metal nitride, is disposed over the silicide structure, and is disposed between the silicide structure and the conductive structure.

In accordance with some embodiments of the present disclosure, the silicide structure has an oxygen content not greater than about 3%.

In accordance with some embodiments of the present disclosure, the metal in the metal nitride of the protection segment includes Ru, Co, Ti, Ni, Mo, Pt, Ta, W, Cr, Zr, Ir, Rh, Os, or any combination thereof.

In accordance with some embodiments of the present disclosure, the protection segment has a thickness ranging from about 0.5 nm to about 4 nm.

In accordance with some embodiments of the present disclosure, an interface between the conductive structure and the protection segment has an oxygen content may be not greater than about 6%.

In accordance with some embodiments of the present disclosure, an interface between the conductive structure and the protection segment has residues including W, Mo, F, Cl, or any combination thereof with a content being not greater than about 5%.

In accordance with some embodiments of the present disclosure, the semiconductor device further includes a capping layer, an insulating layer, and a cover segment. The capping layer is connected between the silicide structure and the protection segment. The insulating layer surrounds the protection segment. The cover segment surrounds the insulating layer.

In accordance with some embodiments of the present disclosure, the capping layer is made of silicon nitride, the insulating layer is made of metal silicon nitride, and the cover segment is made of silicon nitride.

In accordance with some embodiments of the present disclosure, a semiconductor device includes a semiconductor substrate, an epitaxial structure, a silicide structure, a conductive structure, and a conductive liner segment. The epitaxial structure is disposed in the semiconductor substrate. The silicide structure is disposed in the epitaxial structure. The conductive structure is disposed over the silicide structure and is electrically connected to the silicide structure. The conductive liner segment is disposed over the silicide structure, and between the silicide structure and the conductive structure.

In accordance with some embodiments of the present disclosure, the silicide structure has an oxygen content not greater than about 3%.

In accordance with some embodiments of the present disclosure, the conductive liner segment has a carbon content not greater than about 25%.

In accordance with some embodiments of the present disclosure, the resistivity of the conductive liner segment is higher than the resistivity of the conductive structure.

In accordance with some embodiments of the present disclosure, the resistivity of the conductive liner segment is at least 20% higher than the resistivity of the conductive structure.

In accordance with some embodiments of the present disclosure, the conductive liner segment has a thickness ranging from about 0.5 nm to about 4 nm.

In accordance with some embodiments of the present disclosure, the conductive structure and the conductive liner segment are made of the same material.

In accordance with some embodiments of the present disclosure, the semiconductor device further includes a seam that is formed in the conductive structure.

In accordance with some embodiments of the present disclosure, a method of manufacturing a semiconductor device includes: forming a semiconductor structure including a semiconductor substrate, an epitaxial structure disposed in the semiconductor substrate, and an interlayer dielectric layer disposed over the semiconductor substrate; forming a source/drain contact opening in the interlayer dielectric layer to expose the epitaxial structure; forming a silicide structure in the epitaxial structure; forming a conductive liner segment in the source/drain contact opening; and forming a conductive structure filling the source/drain contact opening and over the conductive liner segment.

In accordance with some embodiments of the present disclosure, in the step of forming the conductive liner segment, the conductive liner segment is made of metal nitride. Before the step of forming the conductive structure, the conductive liner segment is etched by halogen-containing gas.

In accordance with some embodiments of the present disclosure, the conductive liner segment is formed by reaction between an oxygen-free precursor and an oxygen-free reactant, and the conductive structure is formed by an oxygen-containing process.

In accordance with some embodiments of the present disclosure, the conductive liner segment and the conductive structure are formed in such a manner that the resistivity of the conductive liner segment is higher than the resistivity of the conductive structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate;
an epitaxial structure that is disposed in the semiconductor substrate;
a silicide structure that is disposed in the epitaxial structure;
a conductive structure that is disposed over the silicide structure and that is electrically connected to the silicide structure; and
a metal nitride layer, that is disposed over the silicide structure, and that is disposed between the silicide structure and the conductive structure,
wherein an interface between the conductive structure and the metal nitride layer has residues including W, Mo, F, Cl, or any combination thereof with a content being not greater than 5%.

2. The semiconductor device as claimed in claim 1, wherein the silicide structure has an oxygen content not greater than 3%.

3. The semiconductor device as claimed in claim 1, wherein metal in the metal nitride layer includes Ru, Co, Ti, Ni, Mo, Pt, Ta, W, Cr, Zr, Ir, Rh, Os, or any combination thereof.

4. The semiconductor device as claimed in claim 1, wherein the metal nitride layer has a thickness ranging from 0.5 nm to 4 nm.

5. The semiconductor device as claimed in claim 1, wherein an interface between the conductive structure and the metal nitride layer has an oxygen content not greater than 6%.

6. The semiconductor device as claimed in claim 1, further comprising:
a capping layer that is connected between the silicide structure and the metal nitride layer;
an insulating layer that surrounds the metal nitride layer; and
a cover segment that surrounds the insulating layer.

7. The semiconductor device as claimed in claim 6, wherein:
the capping layer is made of metal silicon nitride;
the insulating layer is made of metal silicon nitride; and
the cover segment is made of silicon nitride.

8. A semiconductor device comprising:
a semiconductor substrate;
an epitaxial structure that is disposed in the semiconductor substrate;
a silicide structure that is disposed in the epitaxial structure;
a conductive structure that is disposed over the silicide structure and that is electrically connected to the silicide structure;
a conductive liner segment that is disposed over the silicide structure, and that is disposed between the silicide structure and the conductive structure;
a capping layer that is connected between the silicide structure and the conductive liner segment;
an insulating layer that surrounds the conductive liner segment; and
a cover segment that surrounds the insulating layer, wherein
the capping layer is made of metal silicon nitride;
the insulating layer is made of metal silicon nitride; and
the cover segment is made of silicon nitride.

9. The semiconductor device as claimed in claim 8, wherein the silicide structure has an oxygen content not greater than 3%.

10. The semiconductor device as claimed in claim 8, wherein the conductive liner segment has a carbon content not greater than 25%.

11. The semiconductor device as claimed in claim 8, wherein resistivity of the conductive liner segment is higher than resistivity of the conductive structure.

12. The semiconductor device as claimed in claim 11, wherein the resistivity of the conductive liner segment is at least 20% higher than the resistivity of the conductive structure.

13. The semiconductor device as claimed in claim 8, wherein the conductive liner segment has a thickness ranging from 0.5 nm to 4 nm.

14. The semiconductor device as claimed in claim 8, wherein the conductive structure and the conductive liner segment are made of the same material.

15. The semiconductor device as claimed in claim 8, further comprising a seam that is formed in the conductive structure.

16. A semiconductor device comprising:
a semiconductor substrate;
an epitaxial structure that is disposed in the semiconductor substrate;
a silicide structure that is disposed in the epitaxial structure;
a capping layer that is disposed on the silicide structure opposite to the epitaxial structure;

a conductive liner segment that is disposed on the capping layer opposite to the silicide structure; and a conductive structure that is disposed on the conductive liner segment and that is surrounded by the conductive liner segment, wherein the capping layer and the conductive liner segment comprise different materials.

17. The semiconductor device as claimed in claim 16, further comprising:

an insulating layer that is disposed on the epitaxial structure opposite to the semiconductor substrate and that surrounds the conductive liner segment; and a cover segment that is disposed on the epitaxial structure opposite to the semiconductor substrate and that surrounds the insulating layer.

18. The semiconductor device as claimed in claim 17, wherein:

the capping layer is made of metal silicon nitride;

the insulating layer is made of metal silicon nitride; and the cover segment is made of silicon nitride.

19. The semiconductor device as claimed in claim 17, further comprising a contact structure in contact with the conductive structure, the conductive liner segment, and the insulating layer.

20. The semiconductor device as claimed in claim 16, wherein the conductive liner segment is made of metal, and the capping layer is made of metal silicon nitride.

* * * * *